US006946603B2

(12) United States Patent
Rose et al.

(10) Patent No.: US 6,946,603 B2
(45) Date of Patent: Sep. 20, 2005

(54) ENCLOSURE FOR ELECTRICAL AND ELECTRONIC COMPONENTS

(75) Inventors: Friedhelm Rose, Porta Westfalica (DE); Matthias Rose, Rintein (DE)

(73) Assignee: Rolec Gehause-Systeme GmbH (DE)

( * ) Notice: Subject to any disclaimer, the term of this patent is extended or adjusted under 35 U.S.C. 154(b) by 91 days.

(21) Appl. No.: 10/466,567

(22) PCT Filed: Jan. 9, 2002

(86) PCT No.: PCT/DE02/00066

§ 371 (c)(1),
(2), (4) Date: Jul. 16, 2003

(87) PCT Pub. No.: WO02/056436

PCT Pub. Date: Jul. 18, 2002

(65) Prior Publication Data

US 2004/0047113 A1 Mar. 11, 2004

(30) Foreign Application Priority Data

Jan. 16, 2001 (DE) .......................................... 101 01 615

(51) Int. Cl.[7] ................................................. H02G 3/14
(52) U.S. Cl. ........................ 174/66; 174/52.5; 174/52.1; 174/50; 174/62; 174/158 R; 174/67; 174/48; 248/166; 248/149

(58) Field of Search ..................... 174/66, 52.5, 52.1, 174/50, 62, 158 R, 167, 48; 248/166, 149

(56) References Cited

U.S. PATENT DOCUMENTS

| 5,950,852 A | * | 9/1999 | Hudspeth et al. ............. 220/3.8 |
| 5,965,845 A | * | 10/1999 | Reiker .......................... 174/62 |
| 6,303,862 B1 | * | 10/2001 | Reiker .......................... 174/62 |

FOREIGN PATENT DOCUMENTS

| DE | 72 05 740.0 | 5/1972 |
| DE | 88 14 890.4 | 3/1989 |

* cited by examiner

Primary Examiner—Chau N. Nguyen
Assistant Examiner—Anton B. Harris
(74) Attorney, Agent, or Firm—Synnestvedt Lechner & Woodbrige LLP; Richard C. Woodbridge Esq.; Roy Rosser

(57) ABSTRACT

An enclosure for electrical and electronic components comprising a lower part and a cover that can be fastened thereto by a screw connection. Fastening channels are provided in the lower part parallel to screwing locations, via which the enclosure can be fastened to a support. The fastening channels continue inside the cover and open to the exterior so that the enclosure can be fastened to the support when the cover is already fastened to the enclosure lower part.

9 Claims, 2 Drawing Sheets

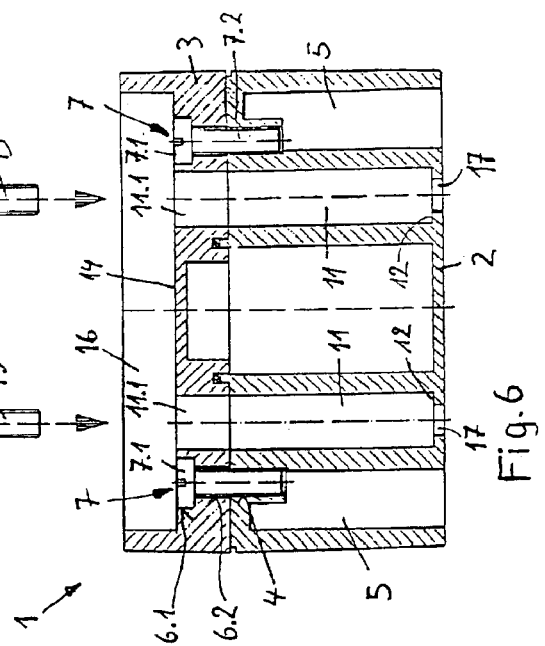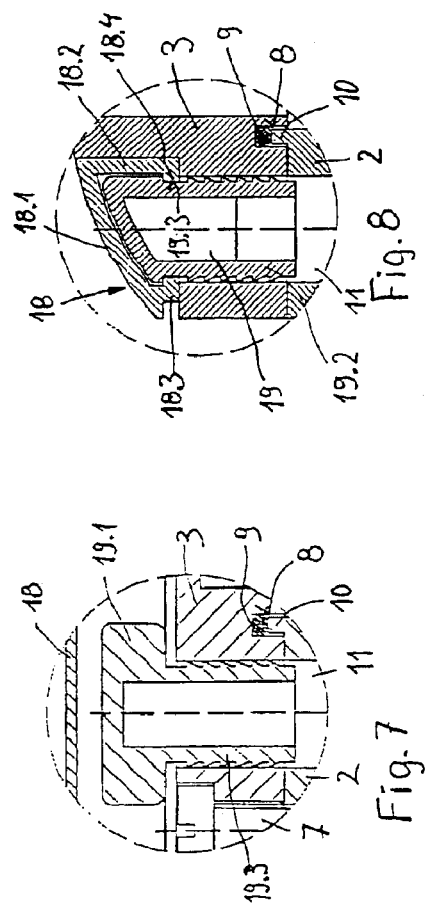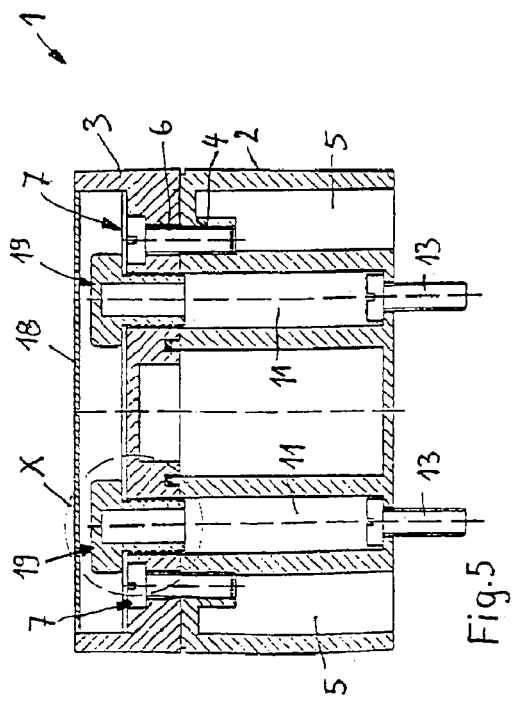

ENCLOSURE FOR ELECTRICAL AND ELECTRONIC COMPONENTS

BACKGROUND OF THE INVENTION

The present invention relates to an enclosure (housing), in particular for accommodating electrical and electronic components, comprising an enclosure lower part (housing lower section) and a cover that can be fastened by means of screw connections. Mounting canals, located parallel to the screw locations in the housing lower section, allow the housing to be fastened to a support.

Commercially available housings, primarily made from aluminium but sometimes also from glass-fibre reinforced polyester or thermo-plastic materials are provided in the lower section of the housing in the regions of the corners with a tapped hole for affixing a cover which is provided, for this purpose, with through bores with a lowering for the screw head. For reasons of saving material and weight a canal is provided adjacent to the tapped holes axially aligned with said holes and extending through to the bottom side of the lower section, the clear widths of said canal being larger than the cross-section of the tapped hole. One fastening channel (mounting canal) each extends in parallel to the aforesaid canals and usually immediately adjacent to them. Said mounting canal commences at the top side of the lower section, i.e. on the closing level, terminating at its bottom end in a through bore of a lower cross-section which in turn extends through to the bottom side of the lower section. This step between the mounting canal and the through bore creates a circular bearing surface for a fastening by means of which the housing lower section can be affixed to the support.

Such a housing is known from DE 88 14 890 U1. It comprises a relatively high housing lower section compared to the height of the cover. As an option for the user of a housing it is provided that cover and housing lower section are interchangeable, i.e. that the cover can be used as housing lower section and the housing lower section as cover respectively. In order to allow this, it must be ascertained that the cover now serving as housing lower section can also be affixed to a support, e.g. a wall or a machine. To this end mounting canals are used as they are known from the housing lower section. In the embodiment of a housing shown in DE 88 14 890 U1 the mounting canals of cover and housing lower section are aligned with one another, i.e. they lead into each other at the closing level of the housing, although for functional reasons this is not required.

This and other housings of this type have a drawback in that, in order to fasten the enclosure to a support, the enclosure always has to be opened so that the mounting canals can be accessed. This is often not desired by users of housings mounting their electronic components in such housings as such electronic components or their wire connections may damaged upon mounting the housing on site. In order to avoid this, it is known with aluminium housings to use screwed or exterior fastening lashes. However, these mean additional expenditure and are not pleasant to look at.

It is the object of the present invention to provide a housing of the aforementioned type avoiding the above-cited disadvantages of the state of the art.

This task is solved by the invention by a housing comprising a housing lower section, a cover that can be fastened to the lower section by a screw connection, and mounting canals disposed in the housing lower section, through which the housing can be fastened to a support. A part of the mounting canals are disposed within the cover and open to the exterior, such that the housing can be fastened to the support when the cover is closed. The cross-sections of the mounting canals are of a size such that mounting screws, each comprising a screw head, can be top-to-bottom inserted through the canals, up to a narrowing of the canal, which generates a stop for the bead of the mounting screw.

Surprisingly, the present solution has never been realized despite the fact that the solution according to the invention appears surprisingly simple. Hereby, in developed embodiments of the invention it can be of advantage, at least optically, if a cover is provided for the mounting canals open at the top of the cover. This can be attained, in the most simple case, by means of caps such as used in the housing known from DE 88 14 890 U1 for covering the cover screw canals.

Advantageous further aspects of the invention are described elsewhere herein.

Hereafter, the invention shall be further illustrated by means of an embodiment example. In the accompanying drawing:

BRIEF DESCRIPTION OF THE DRAWINGS

FIG. 5 a section C—C according to FIG. 1;

FIG. 6 a representation according to FIG. 5 with symbols for the sequence of assembly when affixing the housing to a support;

FIG. 7 a detail X according to FIG. 5 in enlarged scale; and

FIG. 8 a detail Y according to FIG. 2 in enlarged scale.

DETAILED DESCRIPTION OF THE INVENTION

Figure 3:
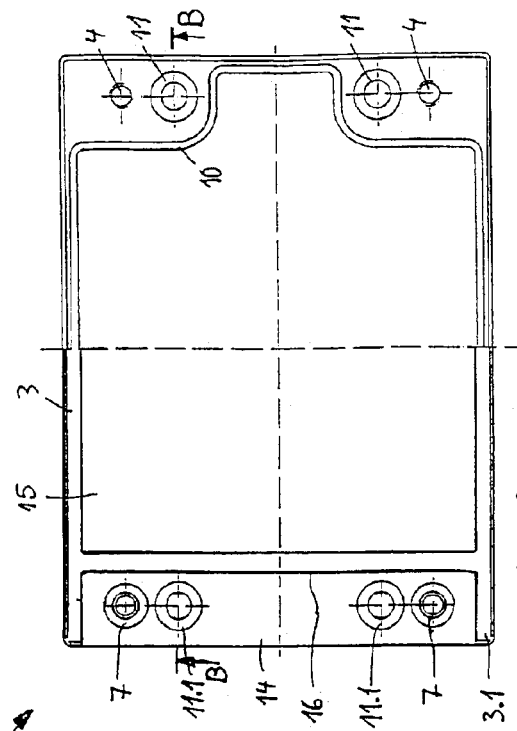
FIG. 3 a top view of the housing, where the right half of the housing is represented with removed cover and the left half of the housing with closed cover but removed cover profile.

The housing 1 shown in the drawing is an aluminium housing of a basic rectangular layout. Said housing 1 consists of a housing lower section 2 closed at the bottom and opened at the top as well as a cover 3 for closing the housing lower section 2. In each of the four corners of the housing lower section 2 a thread bore 4 is provided which opens towards the bottom into a canal 5 which extends through to the lower side of the housing lower section 2. Said thread bores 4 serve for screwing the cover 3 onto the housing lower section 2. To this end the cover 3 is provided with stepped through bores 6 comprising an upper sink area 6.1 to receive the screw head 7.1 of a cover screw 7 followed by a bore area 6.2 which, when the cover is screwed tight, is filled by the screw shaft with a little radial clearance. When all four cover screws 7 are screwed tight the cover 3 is firmly affixed to the housing lower section 2. A groove 8 running around the cover with an in-laid seal 9 and a ledge 10 running around the housing lower section 2 and engaging into the groove 8 ensure a tight fit of the cover 3 on the housing lower section 2.

In the region of each corner of the housing lower section 2 a mounting canal 11 runs adjacent to the canal 5 and parallel to this, said mounting canal commencing at the top side of the housing lower section 2 and being chosen in its cross-section such that a mounting screw 13 with its head 13.1 can be inserted through it towards the bottom. At its lower end the mounting canal 11 terminates in a through bore 17 of a smaller diameter thus creating a shoulder 12 which creates a stop for the head 13.1 of the mounting screw 13 by means of which the housing lower section 2 can be screwed onto a support. The mounting canals 11 are continued towards the top in the cover 3 in sections 11.1 where they terminate in a level 14 lying below the surface of the cover 15 and being created by a corresponding step 16 of the edge region of the cover. This level 14 extends across the entire width of the cover and is laterally defined by protrusions 3.1 of the side wall of the cover 3. It is present in identical form on two opposing sides of the cover. Also terminating at the levels 14 is the sink region 6.1 of the through bores 6 for the cover screws 7. When the cover 3 is mounted on the housing lower section 2 and the cover screws 7 are screwed tight the upper faces of the screw heads 7.1 are flush with the level 14 (FIG. 6).

Although the heads 7.1 of the cover screws 7 are flush with the surfaces 14 this solution is optically not appealing, all the more so, since also the protrusions 11.1 of the mounting canals 11 lie open in the levels 14. Since these levels 14 lie below the level of the cover surface 51 there is the possibility of covering these areas. Herefor, for each level 14 a cover profile 18 made from aluminium is provided. The length of such cover profile 18 is adapted to the spacing between the protrusions 3.1 of the side walls of the cover 3 such that it fills this space with little lateral clearance. Hereby, the cross-section of the cover profile 18 is designed such that this compensates for the discontinuity in the contours of the cover surface created by the step 16 in the edge region of the cover in that the surface 18.1 of the cover profile 15 lowers, as seen from above, concavely down to the level of the surface 14. Corresponding to this curvature the cover profile 18 is provided with a longer interior leg 18.2 and a shorter exterior leg 18.3 (FIG. 8).

From the interior leg 18.2 and the exterior leg 18.3 short bars 18.4 protrude perpendicularly towards the interior, said bars serving to hold two plastic holder pins 19 at the cover profile 18. Said holder pins 19 are provided with a head 19.1 as well as a cylindrical shaft 19.2 protruding downwards from the former. The head 19.1 is provided with diametrically opposed grooves 19.3 which allow the holder pins 19 to be inserted laterally into the cover profile 18. Hereby, the holder pins 19 when inserted into the cover profile 18 are secured against pulling out downwards.

The spacing of the holder pins 19 in relation to the ends of the cover profile 18 is chosen such that their shafts 19.2 are aligned with the protrusions 11.1 of the mounting canals 11. Moreover, the cross-section of the shafts 19.2 is adapted to the cross-section of the protrusions 11.1 such that the holder pins 19 can be impressed relatively easy into the protrusions 11.1 but are still being held securely in said protrusions. In order safeguard this, the shafts 19.2 are provided all around with abutment hook type lips 19.4 which provide resistance against pulling out of the holder pins 19 from the protrusions 11.1 but allow them to be pulled out when necessary.

Figure 1:
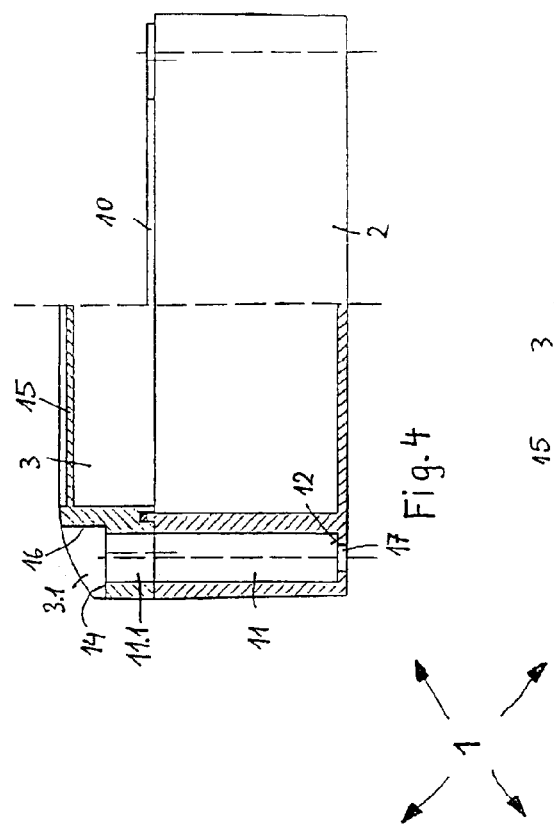
FIG. 1 a top view of a housing with closed cover with assembled cover profiles.
Figure 4:
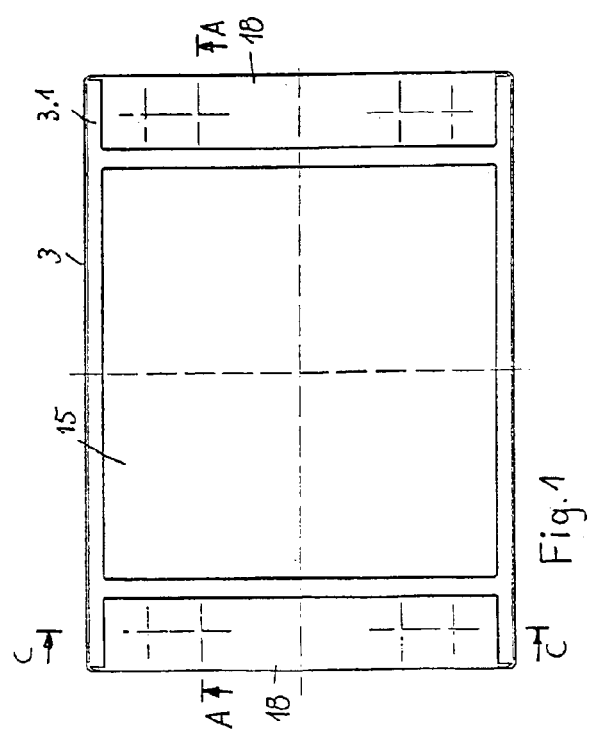
FIG. 4 a section B—B according to FIG. 3, where only the left half of the housing is shown in section.
Figure 2:
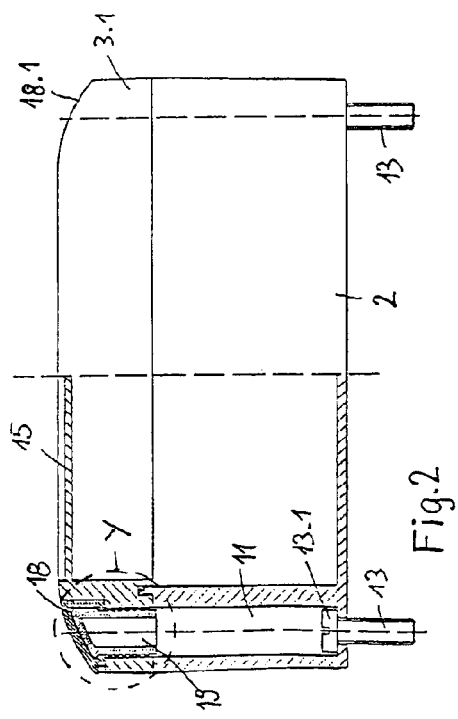
FIG. 2 a section A—A according to FIG. 1, where only the left half of the housing is shown in section.

The housing 1 described above is closed, following the assembly of electrotechnical and electronic components, by screwing the cover 3 to the housing lower section 2. At mounting site it is no longer necessary to open the housing 1 as the mounting canals 11 are accessible via their protrusions 11.1 in the cover 3. In order to mount the housing 1 the mounting screws 13 are inserted into the mounting canals 11 and screwed into corresponding thread bores of the mounting support. Subsequently, the cover profiles 18 are assembled by impressing their holder pins 19 into the protrusions 11.1 of the mounting canals. Thus ensues a consistent cover surface made up of the cover surface 15 and the surfaces 18.1 of the cover profiles 18. The housing 1 then looks like the representation shown in FIGS. 1 and 2. When the housing 1 needs to be opened or disassembled from its support, it is first necessary to remove the cover profiles 18 so that the cover screws 7 or the screws 13 respectively in the mounting canals 11 become accessible.

What is claimed is:

1. A housing for electrical and electronic components comprising:
   (a) a lower section comprising a closed bottom, an open top, at least one thread bore and at least one mounting canal, said mounting canal terminating at a lower end in at least one through bore having a diameter smaller than a clear width of said mounting canal;
   (b) a housing cover removably attached to said lower section by at least one screw connection screwed into said at least one thread bore, thereby creating an enclosure, and having at least one mounting canal protrusion external to said enclosure, said mounting canal protrusion being substantially aligned with said mounting canal,
   such that a mounting screw comprising a head having a diameter smaller than said clear width and greater than said through bore, removably inserted into said mounting canal via said mounting canal protrusion, can secure said housing to a support.

2. The housing of claim 1, further comprising a mounting canal cover for the mounting canals.

3. The housing of claim 2, wherein the crossing section of the housing is rectangular or square-shaped, a mounting canal and screwing location is disposed in each corner of the housing, and the mounting canals and screwing locations each have a common mounting canal cover.

4. The housing of claim 2, wherein the mounting canal cover is flush with the exterior contours of the housing cover.

5. The housing of claim 3, wherein the mounting canal cover is flush with the exterior contours of the housing cover.

6. The housing of claim 4, wherein the mounting canal cover can be secured to the housing cover by a locking mechanism when the locking mechanism is impressed into the mounting canals.

7. The housing of claim 3, wherein the mounting canal cover can be secured to the housing cover by a locking mechanism when the locking mechanism is impressed into the mounting canals.

8. The housing of claim 4, wherein the mounting canal cover can be secured to the housing cover by a locking mechanism when the locking mechanism is impressed into the mounting canals.

9. The housing of claim 5, wherein the mounting canal cover can be secured to the housing cover by a locking mechanism when the locking mechanism is impressed into the mounting canals.

* * * * *